United States Patent
Misra

(10) Patent No.: US 6,274,429 B1
(45) Date of Patent: *Aug. 14, 2001

(54) USE OF SI-RICH OXIDE FILM AS A CHEMICAL POTENTIAL BARRIER FOR CONTROLLED OXIDATION

(75) Inventor: Sudhanshu Misra, The Woodlands, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/182,371

(22) Filed: Oct. 29, 1998

Related U.S. Application Data

(60) Provisional application No. 60/063,529, filed on Oct. 29, 1997.

(51) Int. Cl.[7] .................................................. H01L 21/8247
(52) U.S. Cl. .......................... 438/257; 438/770; 438/971
(58) Field of Search ...................................... 438/257–267, 438/770, 971

(56) References Cited

U.S. PATENT DOCUMENTS

| 5,290,727 | * | 3/1994 | Jain et al. . |
| 5,602,056 | * | 2/1997 | Jain et al. . |
| 5,726,070 | * | 3/1998 | Hong et al. . |
| 5,731,242 | * | 3/1998 | Parat et al. ............................ 438/586 |

* cited by examiner

*Primary Examiner*—Richard Booth
(74) *Attorney, Agent, or Firm*—Jacqueline J. Garner; W. James Brady, III; Frederick J. Telecky, Jr.

(57) ABSTRACT

An oxidation process for reducing the data retention loss (DRL) in a FAMOS device comprising the steps of (1) low temperature deposition of a silicon-enriched silicon oxide (130) over a FAMOS transistor gate stack (116) and (2) annealing said silicon-enriched oxide (130) at a high temperature in oxygen atmosphere to convert said silicon-enriched oxide (130) to a thermal oxide. The silicon enriched oxide (130) acts as both an oxygen getter and diffusion barrier during the annealing step.

16 Claims, 2 Drawing Sheets

USE OF SI-RICH OXIDE FILM AS A CHEMICAL POTENTIAL BARRIER FOR CONTROLLED OXIDATION

This application claims priority under 35 USC § 119 (e) (1) of provisional application No. 60/063,529, filed Oct. 29, 1997.

FIELD OF THE INVENTION

The invention is generally related to the field of semiconductor processing and more specifically to the use of a Si-rich oxide barrier.

BACKGROUND OF THE INVENTION

It is known that the manufacturing of semiconductor devices comprises a chemical processing consisting of a series of steps in which different elements of the devices to be manufactured are progressively made. The semiconductor mainly used is silicon.

Frequently, for silicon devices, one or more steps are required during said chemical processing in which a silicon dioxide should be obtained.

This requirement is particularly demanding in manufacturing electrically programmable fast access non volatile memories, so-called "Flash EPROM", that are provided with Floating-Gate-Avalanche-Injection MOS transistors, called "FAMOS", substantially made up of MOS transistors the gate regions of which are insulated.

Preferably, said FAMOS transistors include, upon the channel area of the substrate, a structure made up of a stack of different layers, so called gate stack, comprising, starting from the surface in contact with the silicon substrate:

- an electrically conductive layer, called Poly1, of polycrystalline silicon known as polysilicon, in contact with the substrate;
- an electrically insulating, three layer structure (oxide—nitride—oxide) of silicon ($SiO_2$—$Si_3N_4$—$SiO_2$), known as "ONO";
- an electrically conductive layer, called Poly2, of polysilicon, forming the floating gate region; and
- an electrically conductive metallic layer of tungsten silicide with variable composition ($WSi_x$), in contact with the Poly2 layer.

For the purpose of obtaining a good adhesion between the silicide and Poly2 layers, an annealing step in oxygen atmosphere is performed upon ending manufacturing said gate stack, so as to promote the growth of a thin layer of silicon dioxide on the silicide and on the substrate exposed to gas. The subsequent steps of device chemical treatment separately carry out the doping of the source and drain regions of FAMOS transistors, and, finally, the metallization and passivation of the manufactured devices.

The quality of a Flash EPROM memory is established by quantifying one or more specifically defined parameters. In particular, an important parameter for evaluating the quality of a Flash EPROM memory is the "data retention loss", known as DRL. Said DRL is quantified by testing the capability of the memory device in retaining test data when it is subjected to severely stressing treatments, such as, for example, high temperature treatments. The comparison between the charges stored in the memory device before and after such a treatment provides a measure of the device DRL. A low value of DRL indicates a long lifetime for the stored charge and, therefore, a better quality of the Flash EPROM memory device.

To minimize the DRL of Flash EPROM devices, the presence of an oxide layer is required in order to protect said gate stacks.

The silicon dioxide layer, that is grown on the device with the aforementioned annealing step carried out to obtain a better adhersion between silicide and Poly2, is not sufficient and it is removed by the subsequent chemical treatment or "etching" preliminary to dopant implantations on the source regions of the FAMOS transistors during the Self Aligned Source (SAS) etch process. The SAS plasma etch process is known to remove the protective thermal oxide layer from the source regions of the FAMOS transistors.

Hence, aiming at minimizing the DRL, a new oxidation step is required. In Prior Art this implies a new annealing step under oxygen atmosphere, i.e. a new thermal oxidation.

However, executing a new thermal oxidation has some drawbacks.

First of all, the oxidation does not uniformly occur on the various layers of the gate stack, thereby causing the so-called peeling of the silicide layer and a reciprocal lifting between layers.

Moreover, when the thermal oxidation step is executed after performing dopant implantations, the dopants diffuse very fast in the substrate crystal lattice till they concentrate, thereby producing dislocations and defects and causing short circuits between the source and drain regions.

Therefore, performing a new thermal oxidation involves severe reliability problems, with resulting degradation of the device quality to a lower level as the one obtainable without a protection oxide layer.

In conclusion, the oxidation according to the prior art to minimize DRL is not feasible due to the high agressiveness of the thermal oxidation.

Consequently, DRL is not effectively minimizable and this implies significant economical losses, because 5% of manufactured devices are not reliable and have to be scrapped.

SUMMARY OF THE INVENTION

The invention is an oxidation process comprising the steps of (1) low temperature deposition of a silicon-enriched silicon oxide over a semiconductor structure and (2) annealing said silicon-enriched oxide at a high temperature in an oxygen atmosphere to convert said silicon-enriched oxide to a thermal oxide.

An advantage of the invention is providing an oxidation process that can reduce the DRL when used in a process for forming a FAMOS transistor.

Another advantage of the invention is providing a less aggressive oxidation process that results in a thermal oxide without the drawbacks of a conventional thermal oxidation process.

Another advantage of the invention is providing an oxidation process having reduced impact on oxidation induced defects within the substrate.

These and other advantages will be apparent to those of ordinary skill in the art having reference to the specification in conjunction with the drawings.

DETAILED DESCRIPTION OF THE EMBODIMENTS

The invention will now be described in conjunction with forming a silicon-rich oxide barrier at the gate level of a FAMOS process. It will be apparent to those of ordinary skill in the art that the use of Si-rich oxide barrier, according to the invention, can be made any device process level where oxygen gettering is required in order to protect the underlying film or device structure while oxidation is required at the overlying structures. For example, the invention may be used as liner layers for controlling etch characteristics or as a means for controlling transistor VTs.

The invention is a two-step oxidation process that provides a preliminary, fast, uniform, and low temperature deposition of a layer of silicon-enriched oxide followed by a reoxidation. The term silicon enriched oxide is used to refer to a silicon oxide layer having an excess of silicon atoms. The silicon-enriched oxide is stable and its composition $SiO_x$, can be accurately controlled during deposition. The preliminary oxide deposition enables the subsequent thermal oxidation step to be carried out in low pressure conditions and not at extreme temperatures. This assures a precise control of the chemical-physical features of the obtained oxide.

Figure 1:
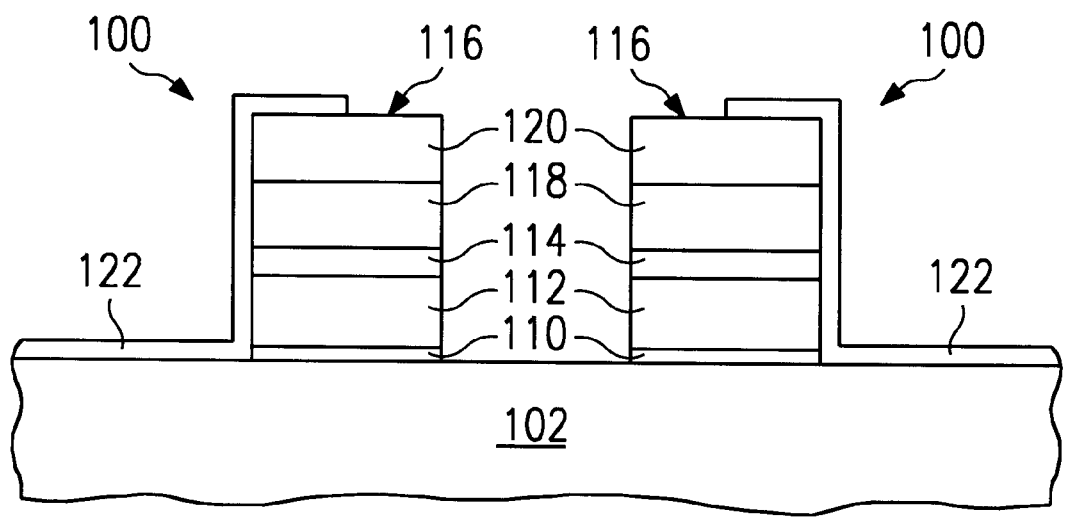
FIGS. 1–2 are cross-sectional diagrams of a FAMOS transistor incorporating the oxidation process of the invention, at various stages of fabrication.

The first step of the oxidation process according to the invention may be inserted in a FAMOS process after the formation of a control gate and prior to the source/drain implants. A partially fabricated FAMOS transistor 100 is shown in FIG. 1. One exemplary FAMOS process will be briefly described. The invention may alternatively be incorporated into other FAMOS processes/structures known in the art. A floating gate dielectric 110 and floating gate (poly1) 112 are formed on a substrate 102. A low voltage gate oxide 114 (typically ONO) is then formed over the structure and the control gate stack 116 is formed. For the control gate stack, a second level of polysilicon 118 is deposited followed by the deposition of a tungsten-silicide 120. The stack 116 is then patterned and etched. The tungsten-silicide 120 is then annealed during which process an oxide 122 is also formed. A self-aligned source (SAS) etch is then performed resulting in the structure shown in FIG. 1. The implants are not performed at this time.

Figure 2:
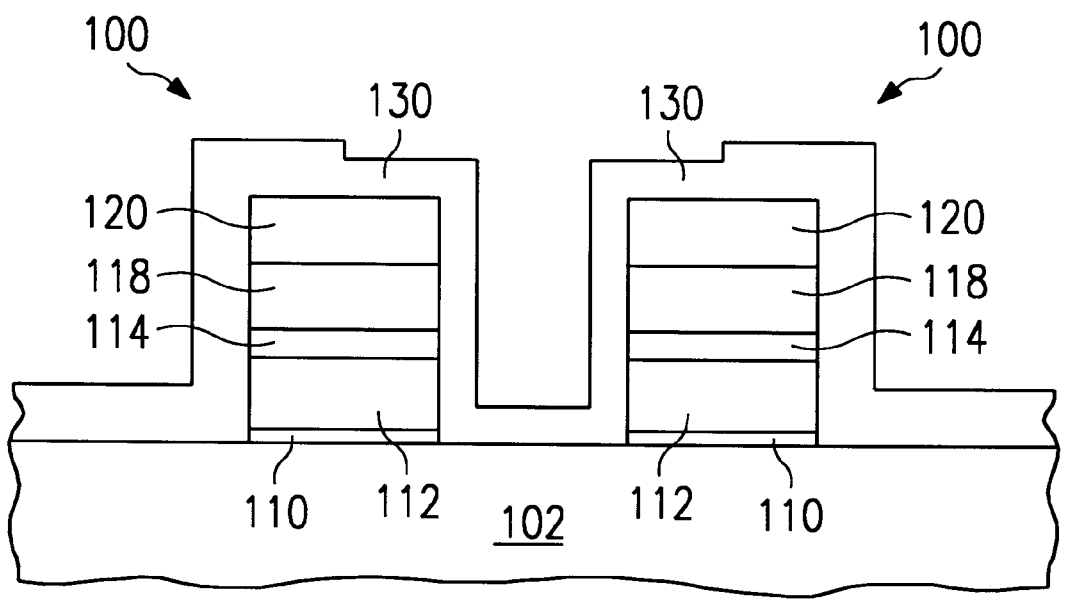

At this point, the first step of the oxidation process may be performed. A silicon-enriched oxide 130 is deposited over the structure as shown in FIG. 2. Silicon-enriched oxide 130 preferably has a thickness on the order of 300Å (thickness range 200–400 Angstroms). A low temperature deposition process is used. By low temperature, it is meant a temperature below that at which thermal oxidation occurs. Preferably, this is in the range of 25° C. to 600° C. Exemplary processes include, but are not limited to, plasma assisted chemical vapor deposition (PCVD), atmospheric pressure chemical vapor deposition (CVD), a low pressure chemical vapor deposition (LPCVD), or an energy enhanced CVD.

Silicon-enriched oxide layer 130 has more silicon incorporated into it than a standard stoichiometric oxide layer. As a result, the refractive index of the layer is increased from the standard 1.46. A refractive index above 1.46 and less than 1.55 is preferable. Increasing the refractive index too high (by incorporating an excessive amount of silicon) results in a conductive layer being formed rather than the desired dielectric layer.

The silicon-enriched layer 130 may be accomplished in a plasma process by increasing the amount of silane introduced and/or reducing the pressure. One exemplary process for forming the silicon-enriched oxide layer 130 of the invention is performed using a single wafer parallel plate Applied Materials 5000 Precision™ plasma enhanced chemical vapor deposition (PECVD) reactor. The following process parameters may be used:

Temperature=380° C.
Pressure=1.6 Torr
RF=80 Watts
Spacing=440 mils
Deposition Rate=3814 Å/min
$SiH_4$-25 sccm
$N_2O$=600 sccm
$N_2$=430 sccm The next step in the standard process is an anneal. The second step (reoxidation) of the oxidation process according to the invention is preferably incorporated into this anneal step. Alternatively, however, the second step (reoxidation) of the oxidation process according to the invention may be incorporated into any one of the subsequent anneals involved in the process. However, performing the re-oxidation process according to the invention after the dopant implants can still induce defects, such as short circuits between the source and drain regions, due to dopant redistribution during high temperature treatments.

Preferably, this anneal 1/reoxidation step is performed at a low pressure and a temperature in the range of 600° C.–1200° C. For example, a furnace anneal in an oxygen ambient at a temperature on the order of 920° C. for a duration on the order of 3 hrs or at a temperature on the order of 1000° C. for 5–10 min. may be used.

During the reoxidation step, the oxygen, diffusing from the gas phase into the silicon-rich oxide 130, converts any excess silicon in the layer 130 into a stoichiometric (thermal) silicon dioxide. Thus, the resulting oxide has a better electrical quality than conventional deposited oxides. The transport steps and transport models of the reoxidation step are described further hereinbelow.

The reoxidation step can be controlled through the tailoring of the composition of the deposited silicon-enriched oxide (i.e., controlling the quantity of excess silicon) so that the silicon (including polysilicon) or silicon substrate is not significantly consumed and that defects are not to be induced therein. During the reoxidation step, the silicon-enriched oxide layer 130 acts both as a diffusion barrier and an as oxygen getter.

Processing then continues with a source/side (S/S) implant (P), the self-aligned source (SAS) implant (As), a second anneal (including cleanup), a FAMOS drain implant (As) and a third anneal. As described above, the reoxidation step may occur at any of these anneal steps. Standard interconnect and packaging steps may then be performed.

The Si-rich concept has several advantages:

1. Oxidation at Anneal 1 (post SAS etch and pre S/S and SAS implants) ensures oxidation in the absence of implanted species while ensuring repair of the oxidation induced defects. Subsequent anneals (2 and 3) perform their standard 'repairs' for SAS implant (P, As) and FD2 implant (As) respectively. Interference of implanted species (especially P) is minimal (if some oxidation induced damage still exists) or non existent (if all oxidation induced damage is repaired). This could potentially reduce source-drain shorts.

2. The use of Si-rich oxide barrier reduces the oxidation rate due to a reduced chemical potential at the stack/barrier oxide interface. This enables a simultaneous diffusion of $O_2$ along with a reduced rate of chemical reaction so that oxidation is more uniform within the depth of the stack, rather than limited at the interface. Such a process (with time) allows similar level of overall oxidation but with more uniformity within the stack thickness. With a stoichiometric $SiO_2$ barrier and, in the limiting case of no barrier, the oxidation is fast and limited to the top few monolayers of the stack. The diffusion is slow compared to the chemical reaction rate. The locations on the stack where aggressive oxidation can cause lifting at the corners due to localized high and uneven oxidation rates are the WSix/poly 2, poly 2/ONO, ONO/poly1 and poly1/Si substrate interfaces. With the use of a Si-rich oxide barrier the oxidation is gradual so that lifting or peeling at these edge locations is significantly reduced or eliminated. This could imply better device reliability data.

3. Use of a plasma deposited Si-rich oxide barrier is more beneficial than a plasma deposited stoichiometric oxide film because during the re-oxidation/anneal step the excess Si in the Si-rich film gets thermally converted to stoichiometric oxide. Thus, after the oxidation/anneal the oxide barrier now has thermal $SiO_2$ within the Si and O atomic layers of the plasma oxide. This enhances the overall quality of the oxide barrier and would be better for DRL issues.

4. The use of an oxide barrier implies that implantation (both SAS and FD2) needs to be done through the screen oxide. This scheme thus, has the benefits associated with implantation though a screen oxide. One of these benefits is the reduction of lattice damage caused by implantation.

Figure 3:
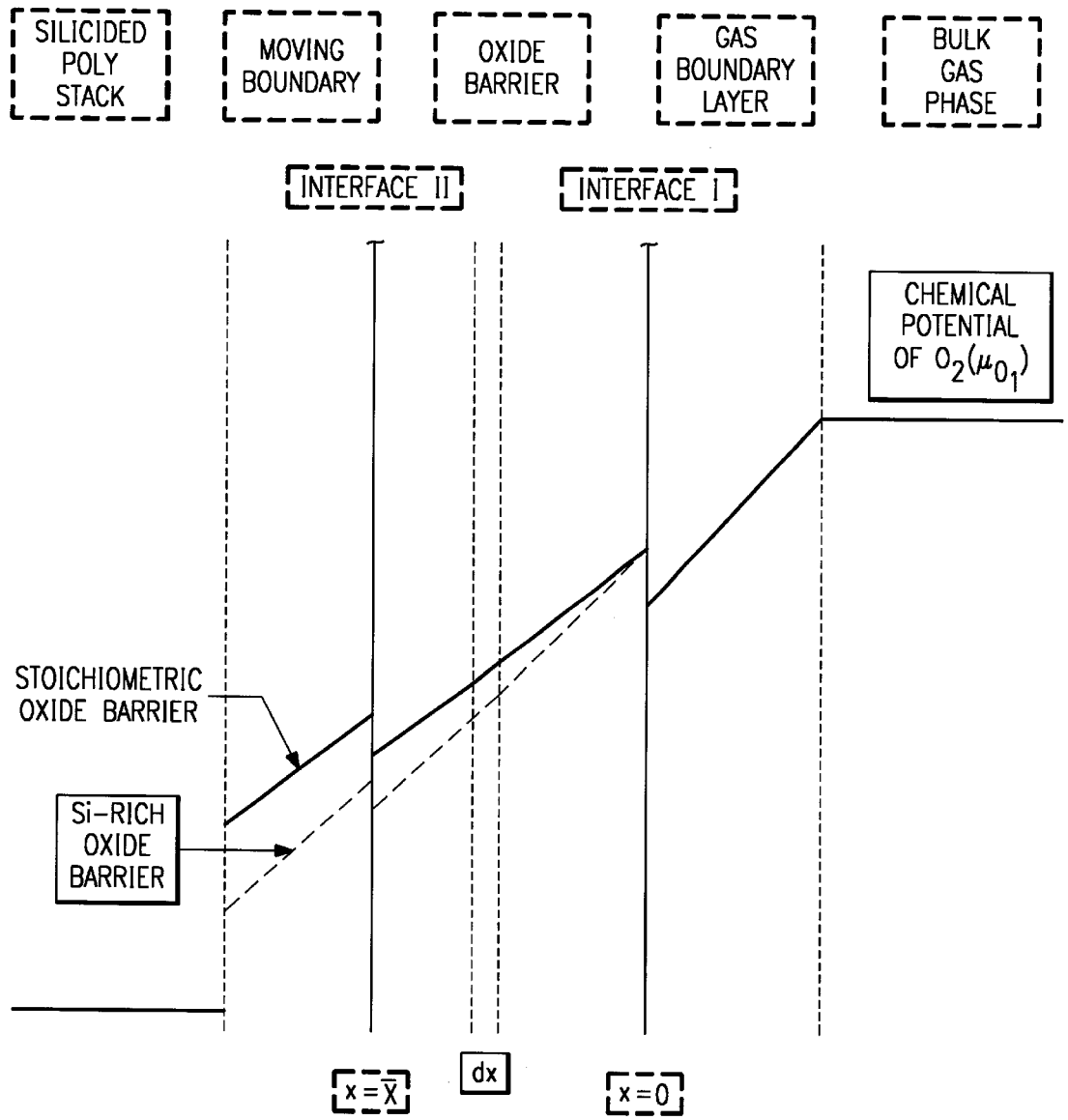
FIG. 3 is a barrier diagram of the transport mechanisms of the invention.

The oxidation process is an unsteady state non-equilibrium process and is best described by means of a transport model explaining the driving force or the chemical potential gradient across the oxide barrier. This is shown schematically in FIG. 3. $O_2$ is the diffusing species, and the driving force for oxidation is the chemical potential gradient of $O_2$ from the gas phase to the $WSi_x$/Poly stack. The process margin is defined as the additional reduction in the chemical potential of $O_2$ across the oxide barrier. The process steps involved are the following:

1. $O_2$ from the bulk gas phase diffuses through the gas interface layer S between the silicon enriched layer 130 and the gas,
2. the diffused $O_2$ gets adsorbed at the oxide barrier interface I,
3. the adsorbed $O_2$ is incorporated at the solid oxide barrier interface I as determined by the equilibrium distribution coefficient for the two media,
4. the adsorbed $O_2$ in the solid oxide barrier diffuses across the oxide barrier and chemically reacts with available Si within the barrier causing an additional reduction in the chemical potential of $O_2$ within the Si-rich oxide barrier,
5. the available $O_2$ after diffusion and reaction within the oxide barrier (Si-rich barrier) gets distributed at the $WSi_x$ (or Poly)/oxide barrier interface II as determined by the corresponding equilibrium distribution coefficients,
6. the $O_2$ distributed in the $WSi_x$ (or Poly) phase is consumed by chemical reaction by the first monolayers of W, Si and poly available from the surface forming corresponding oxides, while also simultaneously diffusing through the atomic layers of the stack,
7. as the first few atomic layers are consumed during oxidation, the $O_2$ species following behind have to diffuse through the thermal oxide so formed in order to oxidize the next atomic layers of the stack. Thus, this comprises the case of a moving boundary.

For the prior art case of a stoichiometeric oxide barrier, the oxygen adsorbed in the solid barrier (step 4 above) diffuses across the oxide barrier, without taking part in any chemical reaction, subject only to the chemical potential gradient of $O_2$ from the gas phase to the interface II between oxide and silicide (or polysilicon) of the gate stack.

The transport mechanism is explained by means of fundamental equations defining the chemical potential of the diffusing species, $O_2$, and through the Gibbs energy of reactions for the associated reactions. From basic thermodynamics, the chemical potential of a species is defined as the partial Gibbs energy of the species at a particular temperature and pressure:

$$d\mu_i = \left(\frac{\partial G}{\partial n_i}\right)_{T,P,n_{j \neq i}} \quad (1.1\text{-}1.2)$$

$$\Rightarrow \mu_i(T, P, x) = \mu_i^{\phi^*}(T) + RT\ln\vartheta_i \approx \mu_i^{\phi^*}(T) + RT\ln P_i$$

where, $\phi_i$ is the fugacity of the species ($O_2$, in this case) and is well approximated as the partial pressure $P_i$ (where 'i' implies $O_2$) due to low pressure operation.

Thus, the driving force for $O_2$ transfer across a stoichiometric barrier oxide is obtained as $$\Delta\mu_{O_2}^{I\text{-}II} = RT\ln\left(\frac{P_{O_2}^I}{P_{O_2}^{II}}\right) \quad (1.3)$$

$\Delta\mu_{O_2}^{Gas\text{-}WSix/PolyStack}$ depends upon the quantity $\Delta\mu_{O_2}^{I\text{-}II}$. The quantity in equation (1.3) is the process margin gained in the case of a stoichiometric $SiO_2$ barrier oxide.

For the case of a Si-rich oxide barrier, we must consider a differential element of thickness 'dx' at a certain position 'x' from the gas-I interface within the oxide and determine the Gibbs energy change due to the reaction:

$$\delta n\text{Si} + \delta n O_2 = \delta n\text{SiO}_2$$

$$\Rightarrow \Delta\mu_{rxn}(x)\big|_x^{x+dx} = -\delta nRT \ln P_{O_2}(x) \quad (1.4\text{--}1.5)$$

Integrating the above equation across the oxide barrier between interface I and II, the chemical potential drop due to the associated reaction (1.4) is calculated as $$\Delta\mu_{O_2}\big|_I^{II} = \int_{x=0}^{x=X} d\mu_{O_2}(x)\bigg|_x^{x+dx} = -RT\int_{x=0}^{x=X}\frac{dn(x)}{n(x)}\ln P_{O_2}(x) \quad (1.6)$$

The quantity in the above equation (1.6) is the added process margin gained by the Si-rich oxide barrier over the case of a stoichiometric oxide in equation (1.3).

Once the diffusion and reaction within the oxide barrier has taken place, the onset of the silicided FAMOS poly stack begins. Here several additional reactions occur together with simultaneous diffusion of $O_2$ through the oxide layer so formed resulting in an inwardly moving boundary.

('Moose Horn' equation)

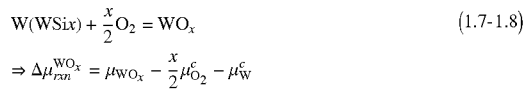
(1.7-1.8)

Si(WSix, poly)+O$_2$=SiO$_2$ $\Rightarrow \Delta\mu_{rxn}^{SiO_2} = \mu_{SiO_2} - \mu_{Si}^c - \mu_{O_2}^c$ (1.9-1.10)

The quantities $\mu_W^c$ and $\mu_{Si}^c$ are expressed as

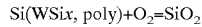

$\mu_{Si}^c(T,P,x_{Si}^c) = \mu_{Si}^{c0*}(T) + RT \ln \gamma_{Si}^c x_{Si}^c$ (1.11-1.12)

where, $\gamma_W^c$ and $\gamma_{Si}^c$ are activity coefficients of W and Si in the solid phases WSi$_x$ and/or poly as the case may be, and are complex functions of T, P and composition.

With the onset of WSi$_x$ oxidation the chemical potential of O$_2$ increases in the solid phase (WO$_x$ and SiO$_2$). The corresponding equations for $\mu_{O_2}^c$ buildup due to the onset of oxidation are presented below:

$\Rightarrow \mu_{O_2}^c(T,P,x_{O_2}) = \mu_{O_2}^{0*c}(T) + RT \ln \gamma_{O_2}^{WO_x} x_{O_2}^{WO_2} + \mu_{O_2}^{0*c}(T) + RT \ln \gamma_{O_2}^{SiO_2}$ (1.13)

@ t=0, $\mu_{O_2}^c$=0
@ t=0$^+$, $\mu_{O_2}^c$ increases as in equation (1.13).

where $\gamma_{O_2}^{WO_x}, \gamma_{O_2}^{SiO_2}$ are the activity coefficients of O$_2$ in the solid phases WO$_x$ and SiO$_2$ respectively and are functions of T, P and $x_{O_2}$. The quantity $\mu_{O_2}^{0*c}(T)$ is the standard state chemical potential of pure O$_2$ in the solid phase at a fixed pressure and is a function of T only.

The above equations (1.7–1.12) quantitatively describe rates of oxidations of different atomic species. The oxidation rates of W and Si (including poly Si) in the different layers of the stack depend upon the values for the Gibbs energy of reactions as in the equations (1.7–1.12) above. The lower the Gibbs energy of reaction, the more probable is the corresponding reaction. The Gibbs energy values depend upon the compositions of the films and the available chemical potential of O$_2$ at the interface of the films. The oxidation of WSix is governed mainly by the bulk resistivity of the film which presets the value for $\mu_W^c$, and by the value $\mu_{O_2}^c$. The 'moose horn' defects that were observed in earlier work during similar re-oxidations done in DMOS4 can be well understood and controlled through the equations (1.7–1.8). These defects are formed when the Gibbs energy of reaction (1.7) is low, either due to high $\mu_W^c$ or due to high $\mu_{O_2}^c$ or due to both. By the use of a Si-rich oxide the value of $\mu_{O_2}^c$ is lowered, and by the use of a higher bulk resistivity WSix film the value of $\mu_W^c$ is lower; both suppressing the 'moose horn' equation (1.7). With the onset of oxidation $\mu W_{WO_x}$ and $\mu_{SiO_2}$ increase, eventually causing oxidation rates for both W and Si in the WSix to drop. Compared to a pure SiO$_2$ capox, the Si-rich capox reduces $\mu_{O_2}^c$ thereby raising $\Delta\mu_{rxn}^{WO_x}$. However, $\Delta\mu_{rxn}^{SiO_2}$ is also raised due to low $\mu_{O_2}^c$. But with the onset of oxidation, $\mu_{SiO_2}$ is less to start with. In the case of pure SiO$_2$ capox, $\Delta\mu_{rxn}^{SiO_2}$ is low (due to higher $\mu_{O_2}^c$) so that Si oxidation is higher. But with the onset of oxidation $\mu_{SiO_2}$ increases (and with higher $\mu_{O_2}^c$) the $\Delta\mu_{rxn}^{SiO_2}$ levels off to a value comparable to that for a Si-rich capox process. Due to this reason the oxidations of both W and Si in the silicide will be higher at the beginning of oxidation for a pure SiO$_2$ capox process than for a Si-rich capox process. This 'process margin' can be used to set up a suitable 'process window' for device performance requirements depending upon the experimental observations of the stack through SEM or TEM cross sections. Theoretically, the 'moosehorning' phenomena would be less for a Si-rich capox process. Also, any adverse effect of silicide or poly lifting seen during this stack oxidation would be less for a Si-rich capox process. This should also be an important criterion for deciding the process margin for stack re-oxidation.

These equations (1.7 to 1.12) govern the uniformity of oxidation within the stack depth, and also theoretically indicate the minimization of differential oxidations at the corners of the stack where different layers exist.

The preliminary deposition of silicon-enriched oxide enables a larger process margin to be achieved with respect to the subsequent thermal oxidation, namely a larger tolerance as to the chemical-physical processing parameters, in the oxidation process of a silicon containing substrate, with drastic reduction in the economical losses due to defects induced with traditional oxidation techniques and, in the case of manufacturing a FAMOS transistor for Flash EPROM devices, to low values of DRL.

The oxidation process according to the invention can be applied in all the productions of silicon devices where it is desired to control the oxidation aggressiveness, such as in building layers for controlling the etching characteristics and in adjusting the MOS transistor threshold voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An oxidation process, comprising the steps of:

depositing at a low temperature a silicon-enriched silicon oxide on a surface and sidewalls of a gate stack; and reoxidizing said silicon enriched oxide on the surface and sidewalls of the gate stack.

2. The process of claim 1, wherein said low temperature is less than that required for thermal oxidation.

3. The process of claim 1, wherein said low temperature is in the range of 25° C. to 600° C.

4. The process of claim 1, wherein said depositing step comprises a plasma-assisted chemical vapor deposition.

5. The process of claim 1, wherein said depositing step comprises a low pressure chemical vapor deposition.

6. The process of claim 1, wherein said depositing step comprises an atmospheric pressure chemical vapor deposition.

7. The process of claim 1, wherein said depositing step comprises a energy enhanced chemical vapor deposition.

8. The process of claim 1, wherein said reoxidation step is carried out at low pressure.

9. The process of claim 1, wherein said reoxidation step occurs at a temperature in the range of 600° C. to 1200° C.

10. A method of fabricating a non-volatile memory, comprising the steps of:

forming a gate stack on a substrate, said gate stack comprising a first polysilicon layer, a gate dielectric layer, a second polysilicon layer and a metallic suicide layer;

depositing at a low temperature a silicon-enriched oxide layer over said gate stack including adjacent sidewalls of said gate stack;

annealing said silicon-enriched oxide layer in an oxygen ambient at a temperature sufficient for thermal oxidation to occur including a portion of said silicon-enriched oxide adjacent sidewalls of the gate stack;

implanting source and drain regions.

11. The method of claim 10, wherein said annealing step occur prior to said implanting step.

12. The method of claim 10, wherein said annealing step occurs after said implanting step.

13. The process of claim 10, wherein said low temperature is in the range of 25° C. to 600° C.

14. The process of claim 10, wherein said depositing step comprises a chemical vapor deposition.

15. The process of claim 10, wherein said reoxidation step is carried out at low pressure.

16. The process of claim 10, wherein said silicon enriched oxide layer has a refractive index between 1.46 and 1.55.

* * * * *